United States Patent
Engholm et al.

(10) Patent No.: US 8,890,507 B2
(45) Date of Patent: Nov. 18, 2014

(54) PHASE TRANSIENT RESPONSE MEASUREMENTS USING AUTOMATIC FREQUENCY ESTIMATION

(75) Inventors: Kathryn A. Engholm, Portland, OR (US); Soraya J. Matos, Beaverton, OR (US); Shigetsune Torin, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 1125 days.

(21) Appl. No.: 12/783,300

(22) Filed: May 19, 2010

(65) Prior Publication Data

US 2011/0285381 A1    Nov. 24, 2011

(51) Int. Cl.
| | |
|---|---|
| G01R 23/02 | (2006.01) |
| G01R 19/00 | (2006.01) |
| G01R 31/28 | (2006.01) |
| G01R 27/28 | (2006.01) |

(52) U.S. Cl.
CPC ............ *G01R 31/2837* (2013.01); *G01R 27/28* (2013.01)
USPC .................. 324/76.52; 324/76.39; 324/76.11

(58) Field of Classification Search
CPC ............................. G01R 31/2837; G01R 27/28
USPC ................................ 324/76.11–76.52; 702/1
See application file for complete search history.

(56) References Cited

U.S. PATENT DOCUMENTS 6,433,531 B1 * 8/2002 Regev ......................... 324/77.11

OTHER PUBLICATIONS

Agilent "E5052B Signal Source Analyzer Help," "Confirming Result of Phase Transient Measurement", Jun. 12, 2009, pp. 1-8.*
Agilent Application Note 5989-9848EN, "Agilent E5052B Signal Source Analyzer/Boosting PLL Design Efficiency" Nov. 21, 2008, available at http://cp.literature.agilent.com/litweb/pdf/5989-9848EN.pdf.
"E5052B Signal Source Analyzer Help," "Confirming Result of Phase Transient Measurement" (under "Measurement" ==> "Transient Measurement"), Help Revision Date Jun. 12, 2009, available at http://ssa.tm.agilent.com/e5052b/manuals/webhelp/eng/?NAV_ID=-11143.0.00&COUNTRY_CODE=US&LANGUAGE_CODE=eng.

* cited by examiner

*Primary Examiner* — Melissa Koval
*Assistant Examiner* — Farhana Hoque
(74) *Attorney, Agent, or Firm* — Michael A. Nelson; Marger Johnson & McCollom PC

(57) ABSTRACT

A method of measuring the phase transient response of a device under test automatically provides a flattened phase transient response without any user intervention. The method comprises the steps of calculating an instantaneous phase waveform based on an instantaneous voltage waveform that represents an output signal of the device under test as it steps from a first frequency to a second frequency, calculating an instantaneous frequency waveform based on the instantaneous phase waveform, automatically estimating the second frequency based on the instantaneous frequency waveform without any user intervention, and flattening the instantaneous phase waveform based on the estimate of the second frequency.

9 Claims, 8 Drawing Sheets

PHASE TRANSIENT RESPONSE MEASUREMENTS USING AUTOMATIC FREQUENCY ESTIMATION

FIELD OF THE INVENTION

The present invention relates to test and measurement instruments, and more particularly to phase transient response measurements.

BACKGROUND OF THE INVENTION

The behavior of a system is commonly characterized by stimulating the system with a step input and then measuring the resulting transient response of the system, also referred to as the "step response." For example, a phase-locked loop (PLL) can be characterized by programming the PLL to step or "hop" from a first frequency to a second frequency and then measuring the resulting transient response of the PLL. For more information on step response measurements, see the book "Modern Control Engineering" by Katsuhiko Ogata, fifth edition, Prentice Hall, 2009.

Test and measurement instruments such as real-time spectrum analyzers, vector signal analyzers, and oscilloscopes are typically used to measure the transient response of a PLL. These test and measurement instruments digitize the output signal of the PLL and then process it to provide a display of the instantaneous frequency of the output signal as shown in FIG. 1, also referred to as the "frequency step response." Some test and measurement instruments also provide various measurements of the frequency step response such as delay time, rise time, peak time, maximum overshoot, mean settled value, settling time, and so on. Settling time, which indicates how quickly the output signal settles to the second frequency, is of particular interest to users because it has a direct impact on how much data the PLL is able to transmit between each hop. For more information on characterizing phase-locked loops using test and measurement instruments, see Tektronix document number 37W-18170 titled "Characterizing Phase Locked Loops Using Tektronix Real-Time Spectrum Analyzers" available at http://www.tek.com/.

Increasingly, in addition to needing to measure how quickly the output signal settles to the second frequency, users also need to measure how quickly the output signal settles to a stable phase, also referred to as "phase settling time." Some test and measurement instruments can process the output signal of the PLL to provide a display of the instantaneous phase of the output signal as shown in FIG. 2, also referred to as the "phase transient response." However, it is difficult to measure the phase settling time based on such a phase transient response because the instantaneous phase accumulates and wraps so rapidly, thereby masking subtle phase settling behavior.

In order to reveal the subtle phase settling behavior, some test and measurement instruments process the phase transient response to provide a "flattened" phase transient response as shown in FIG. 3. However, in order to do so, all of these test and measurement instruments require that the user intervene in some way. Some test and measurement instruments require that the user manually enter the second frequency value. Other test and measurement instruments require that the user manually specify points on the phase transient response where the user believes that the phase transient response has settled to a stable phase. In either case, requiring user intervention is time-consuming and inconvenient for the user.

What is needed is a method of measuring the phase transient response of a system under test that does not require any user intervention.

SUMMARY OF THE INVENTION

Accordingly, embodiments of the present invention provide a method of measuring the phase transient response of a device under test that automatically provides a flattened phase transient response without any user intervention. The method comprises the steps of calculating an instantaneous phase waveform based on an instantaneous voltage waveform that represents an output signal of the device under test as it steps from a first frequency to a second frequency, calculating an instantaneous frequency waveform based on the instantaneous voltage waveform, calculating an estimate of the second frequency based on the instantaneous frequency waveform, and flattening the instantaneous phase waveform based on the estimate of the second frequency.

The objects, advantages and other novel features of the present invention are apparent from the following detailed description when read in conjunction with the appended claims and attached drawing.

DETAILED DESCRIPTION OF THE INVENTION

Figure 1:
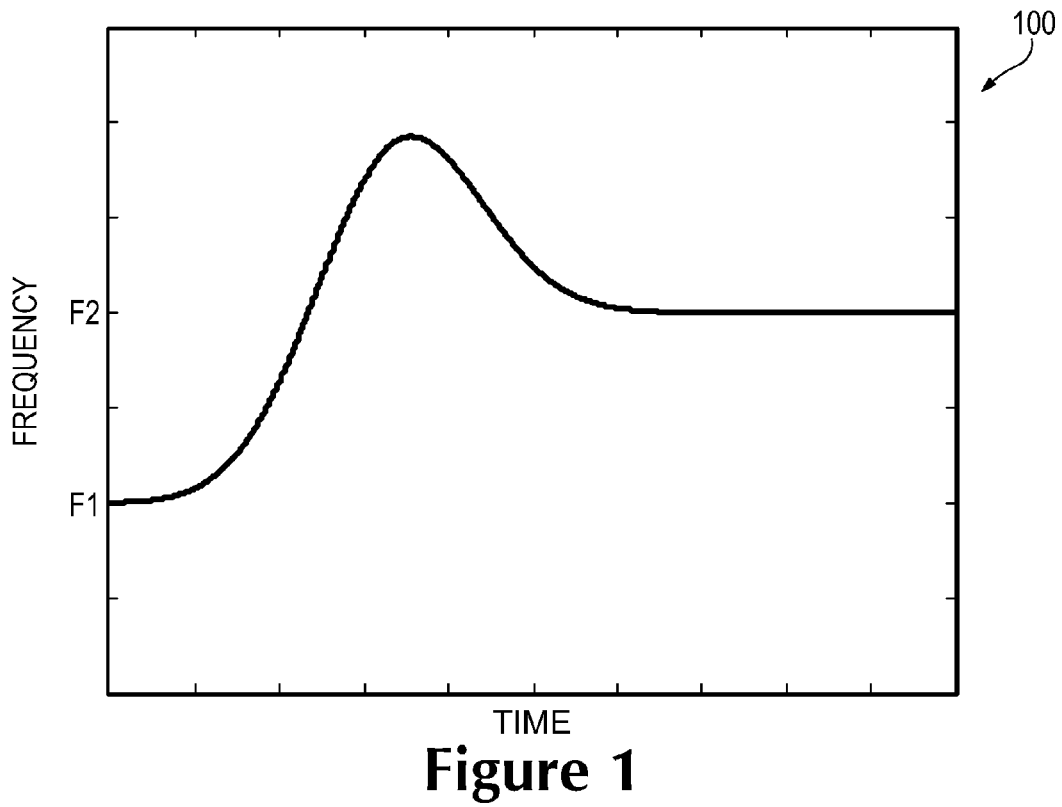
FIG. 1 depicts an instantaneous frequency waveform.
Figure 2:
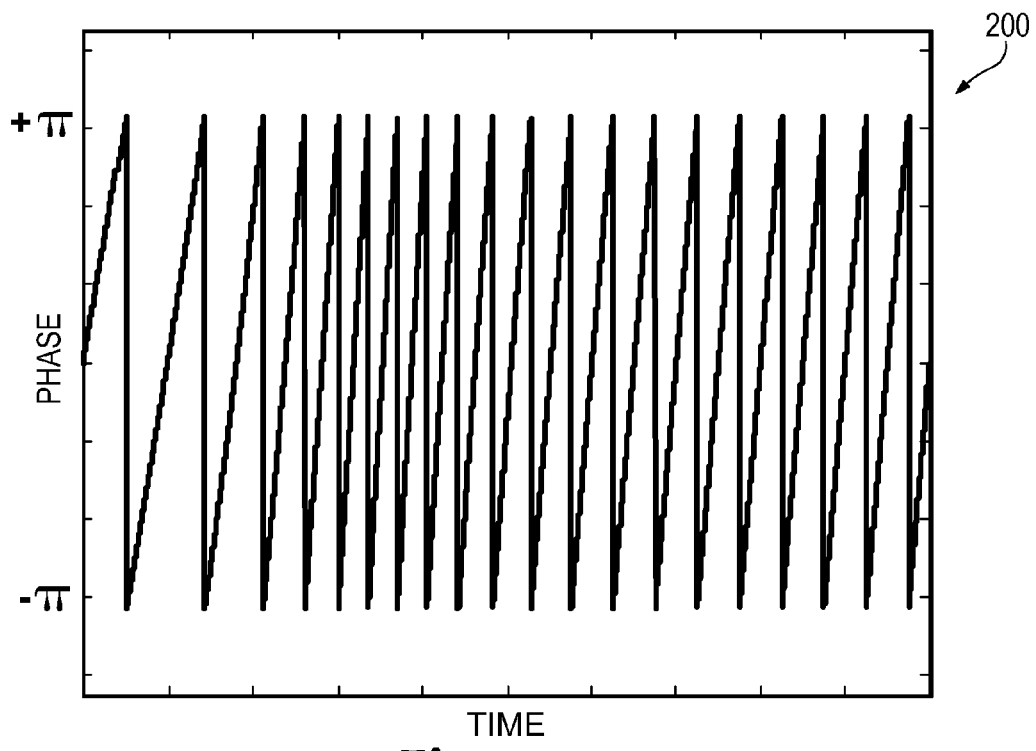
FIG. 2 depicts an instantaneous phase waveform.
Figure 3:
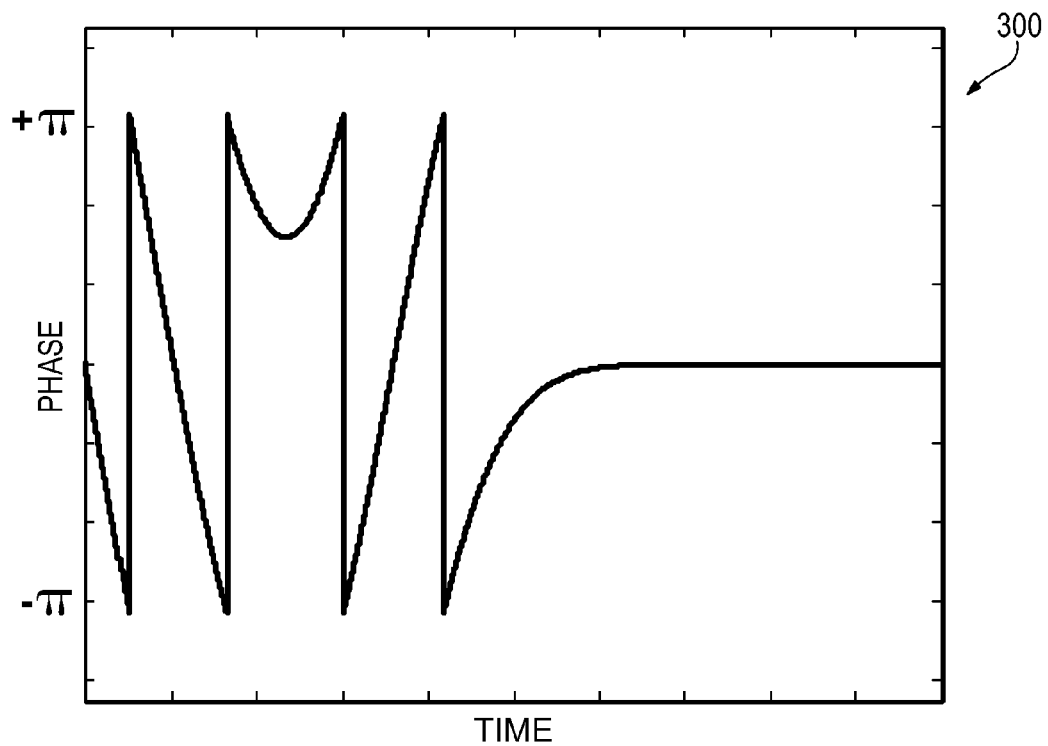
FIG. 3 depicts a flattened instantaneous phase waveform.
Figure 4:
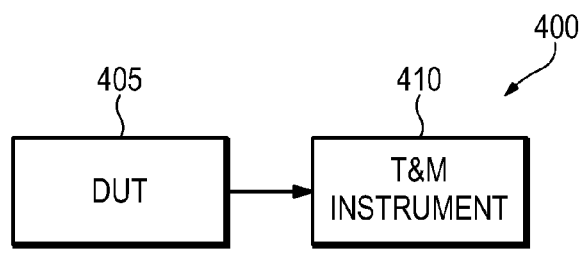
FIG. 4 depicts a high-level block diagram of a test setup used for measuring the phase transient response of a device under test.
Figure 5:
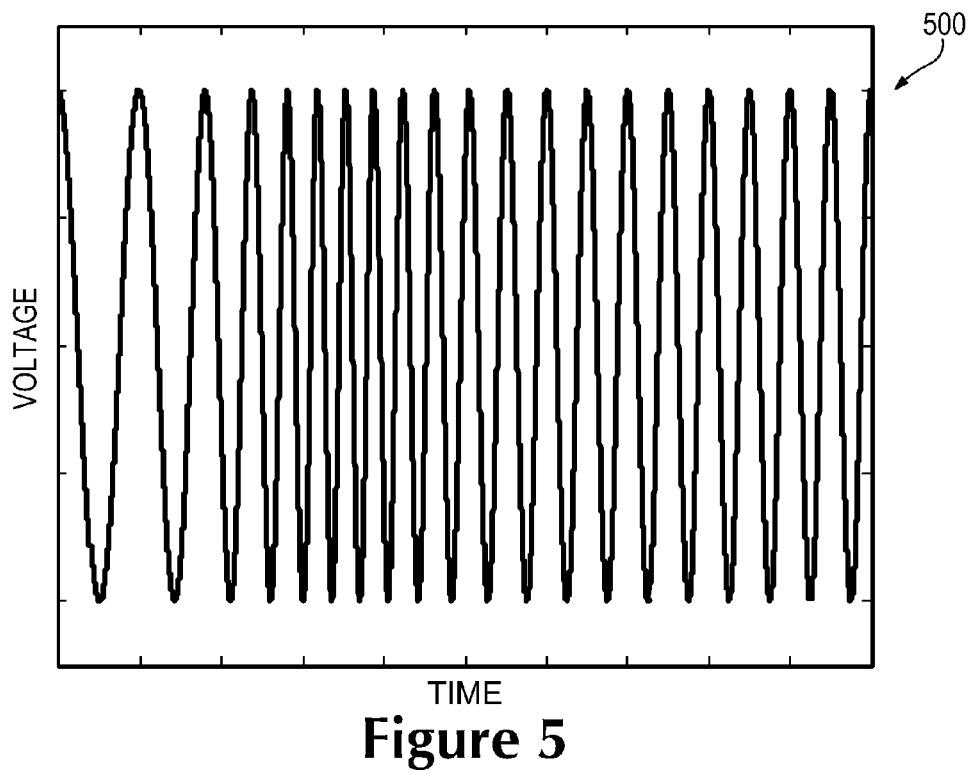
FIG. 5 depicts the output signal of the device under test of FIG. 4.
Figure 6:
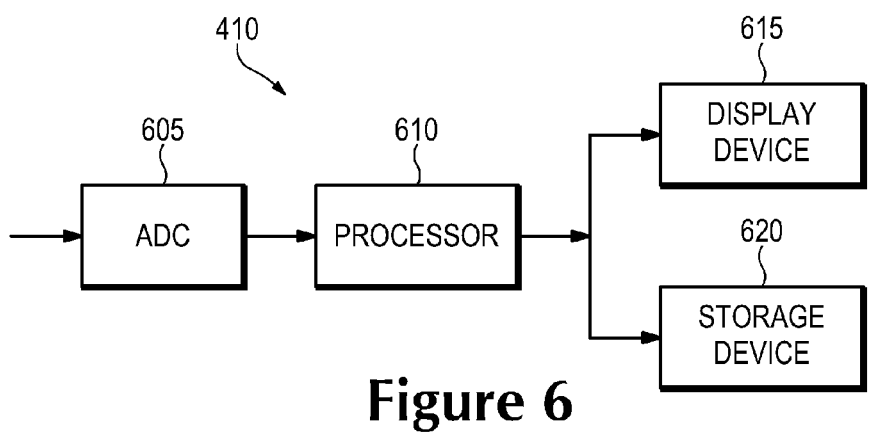
FIG. 6 depicts a high-level block diagram of the test and measurement instrument of FIG. 4.
Figure 7:
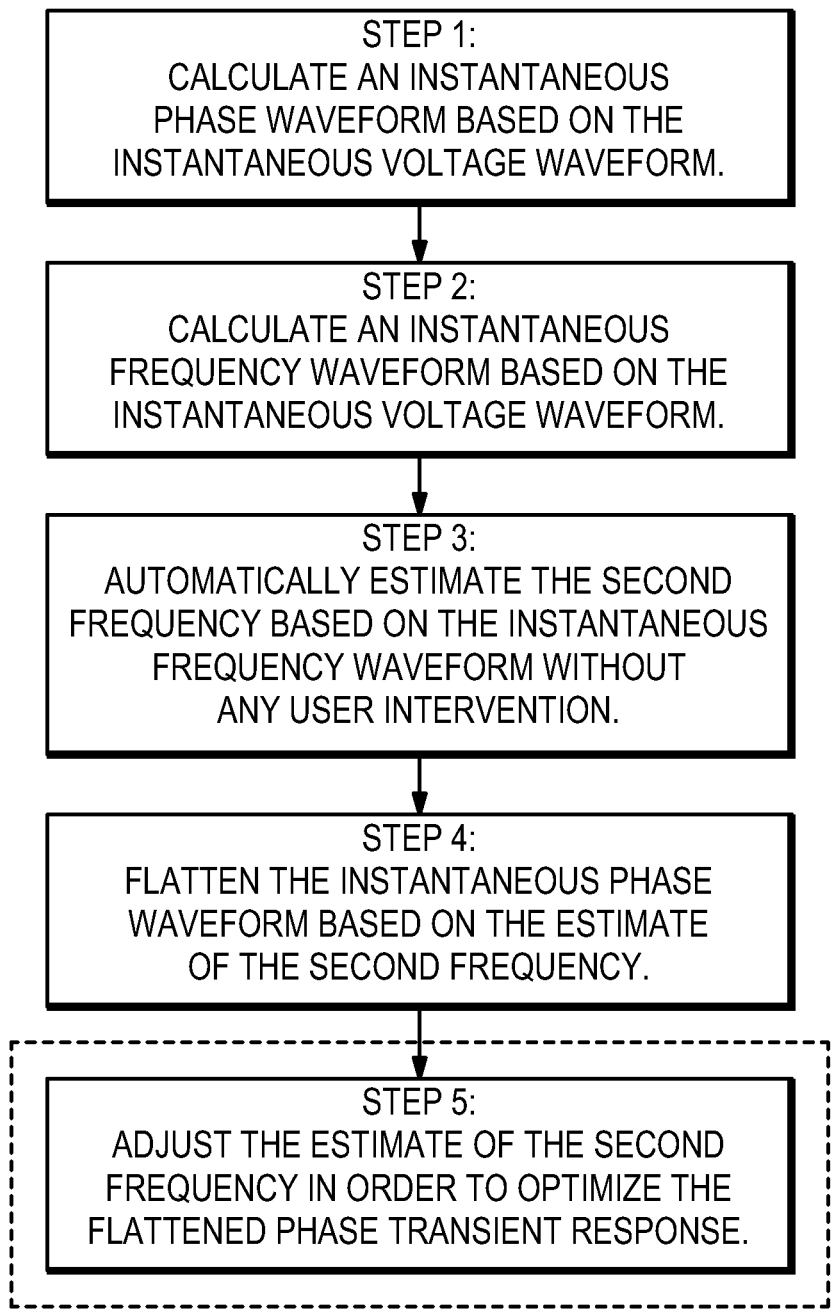
FIG. 7 depicts a flowchart of a method of measuring the phase transient response of a device under test according to an embodiment of the present invention.

Referring now to FIG. 4, a device under test (DUT) 405 is programmed to step or "hop" from a first frequency (F1) to a second frequency (F2), for example, by programming a divider (not shown) inside of the DUT 405. In response, the DUT 405 produces an output signal 500 as shown in FIG. 5 which is input to a test and measurement instrument 410. Referring now to FIG. 6, the test and measurement instrument 410 digitizes the output signal using an analog-to-digital converter (ADC) 605 to produce a plurality of digital samples that represent the instantaneous voltage of the output signal of the DUT 405, also referred to as an "instantaneous voltage waveform." A processor 610 processes the instantaneous voltage waveform in various ways, and the results of the processing may be displayed on a display device 615 or stored in a storage device 620. In an embodiment of the present invention, the processor 610 processes the instantaneous phase waveform by performing the steps illustrated in FIG. 7 and described below.

Figure 8:
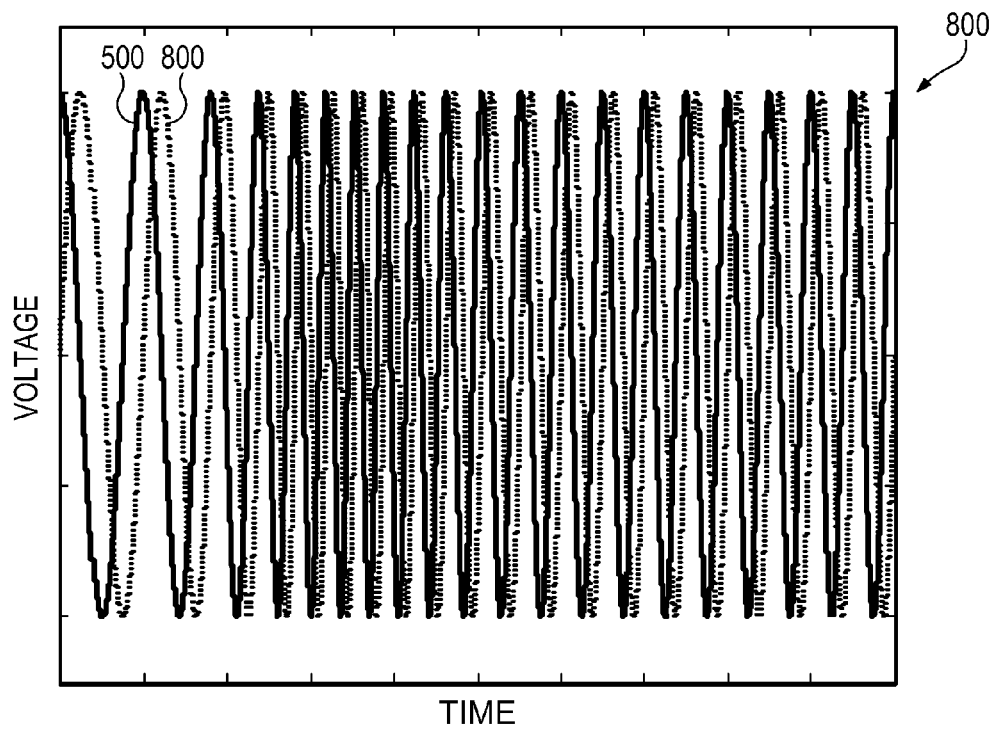
FIG. 8 depicts an instantaneous voltage waveform and a phase-shifted replica.
Figure 9:
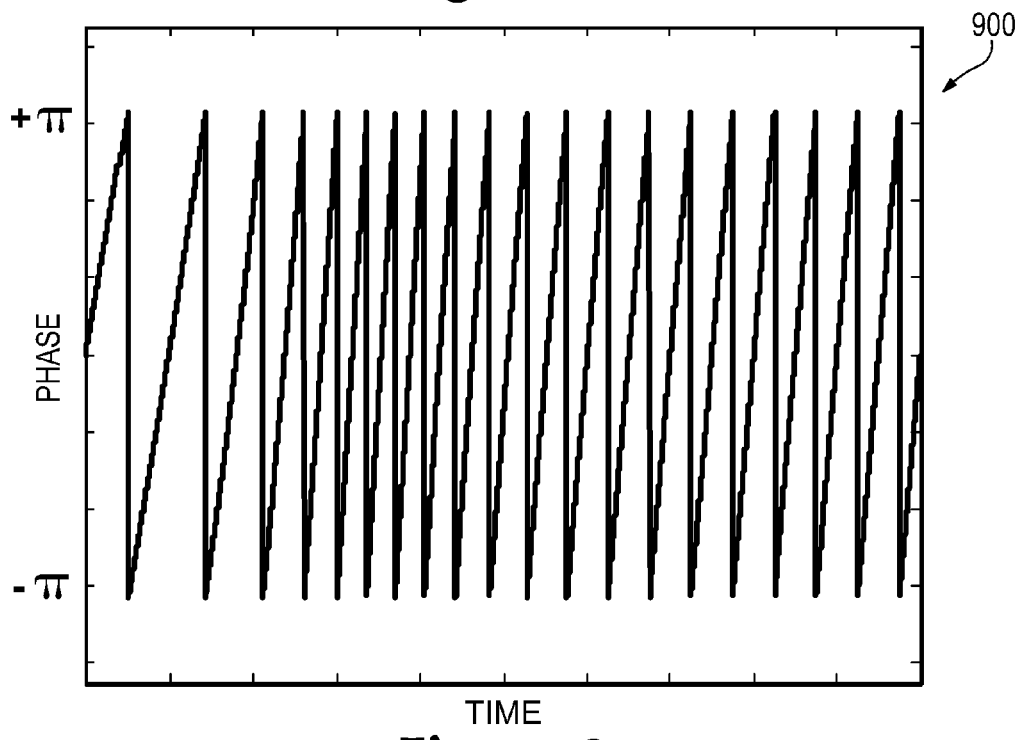
FIG. 9 depicts an instantaneous phase waveform.

Step 1: Calculate an instantaneous phase waveform based on the instantaneous voltage waveform. In some embodiments, this step comprises the following steps: (1) Generate a replica 800 of the instantaneous voltage waveform 500 that is phase-shifted by π/2 radians as shown in FIG. 8. The instantaneous voltage waveform represents an in-phase (I) component and the phase-shifted replica represents a quadrature (Q) component. (2) Calculate the instantaneous phase waveform 900 as shown in FIG. 9 using the following equation:

$$\text{phase} = \arctan\left(\frac{Q}{I}\right) \quad \text{(Equation 1)}$$

Figure 10:
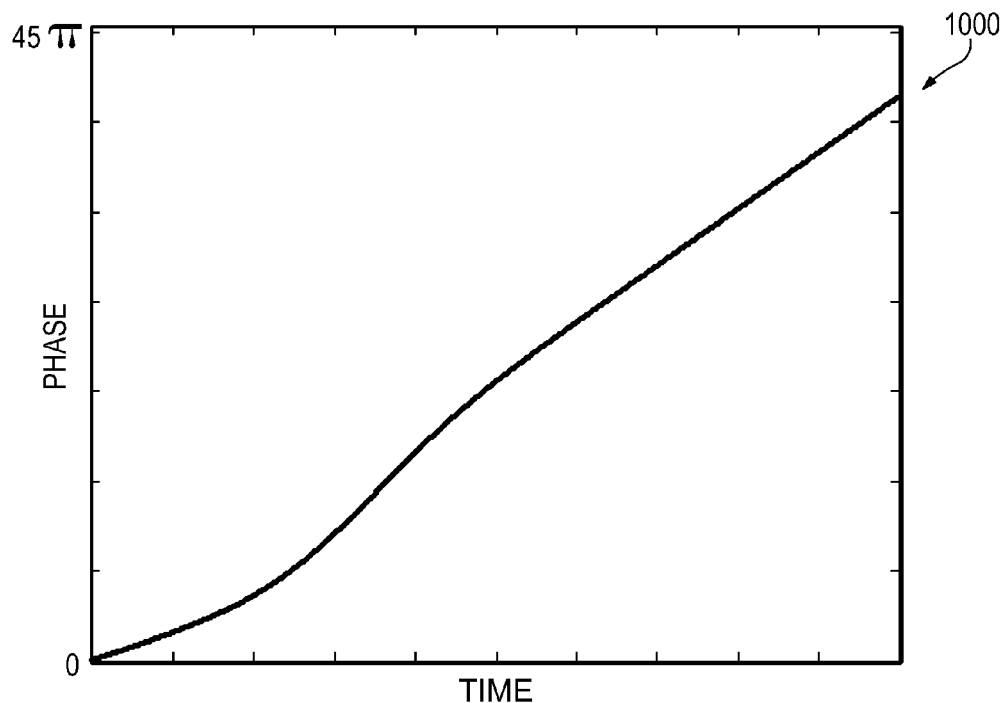
FIG. 10 depicts a measured phase ramp.

In order to provide illustrations for the following steps that are simpler and therefore easier to understand, the instantaneous phase waveform is now unwrapped to form an unwrapped instantaneous phase waveform 1000 as shown in FIG. 10, also referred to herein as a "measured phase ramp" for simplicity. It will be appreciated, however, that the following steps may also be carried out without this unwrapping step.

Figure 11:
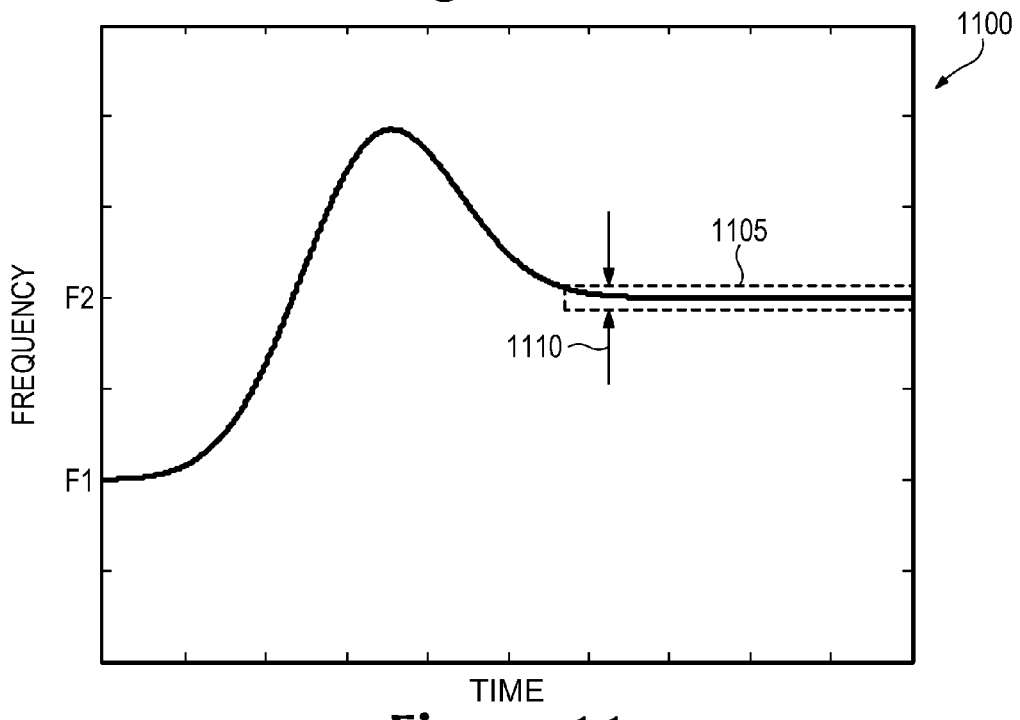
FIG. 11 depicts an instantaneous frequency waveform.

Step 2: Calculate an instantaneous frequency waveform based on the instantaneous voltage waveform. In some embodiments, this step comprises the step of differentiating the measured phase ramp to produce an instantaneous frequency waveform 1100 as shown in FIG. 11. Frequency equals the derivative of phase, as is illustrated by the following example: Suppose that the value of a measured phase ramp increases by 20π radians over a 1 microsecond time interval. The derivative of the measured phase ramp equals the change in phase divided by the change in time, or 20π radians/(1 microsecond)=20π Mega-radians/second. Since 2π radians equal one cycle, this is equivalent to 20π/(2π) Mega-cycles/second, or 10 MHz.

It will be appreciated that an instantaneous frequency waveform may be calculated in various other ways. For example, an instantaneous frequency waveform may be calculated by measuring the period of each cycle of the instantaneous voltage waveform, calculating the inverse of each period measurement, and then interpolating the results to produce a substantially similar instantaneous frequency waveform.

Step 3: Automatically estimate the second frequency (F2$_{EST}$) based on the instantaneous frequency waveform without any user intervention. In some embodiments, this step comprises the following steps: (1) Locate the segment 1105 of the instantaneous frequency waveform that corresponds to the period where the output signal has settled to the second frequency, also referred to as the "settled period." The settled period can be located by identifying the set of contiguous points of the instantaneous frequency waveform after the hop whose frequency values all equal the same frequency value within a specified tolerance range 1110. For example, the settled period may consist of the set of contiguous points whose frequency values all equal 1 GHz within 1 MHz, or equivalently, within 0.1% of 1.0 GHz. (2) Calculate the average frequency value of all of the points of the instantaneous frequency waveform within the settled period to produce an estimate of the second frequency. In this manner, the second frequency is automatically estimated without any user intervention.

Figure 12:
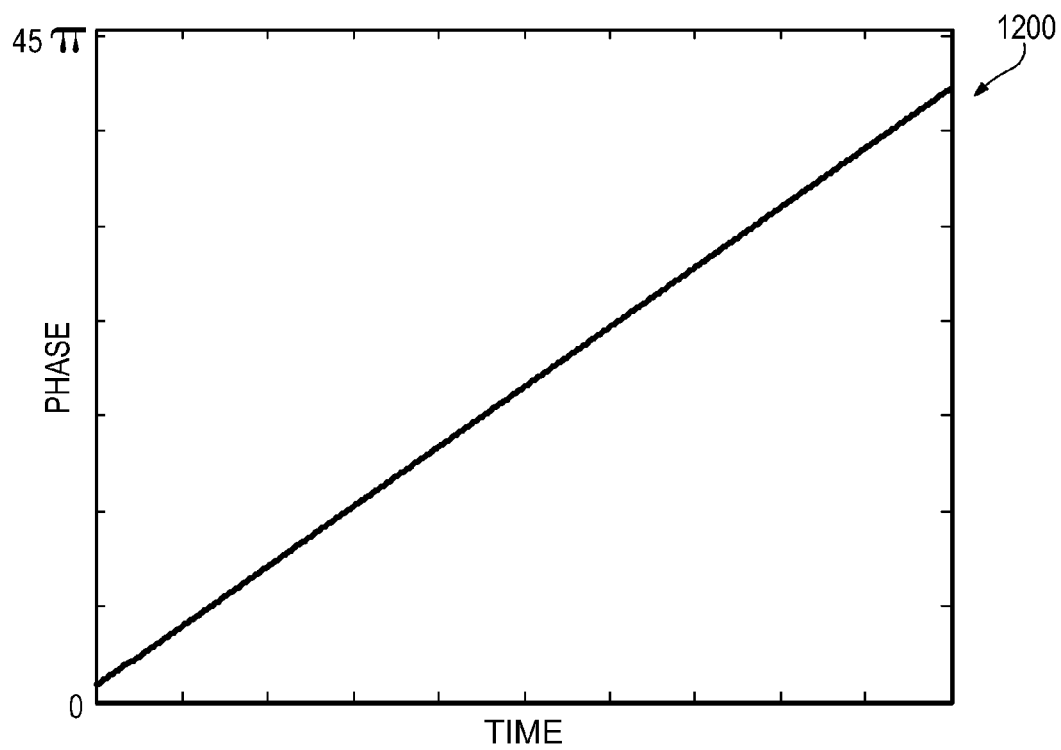
FIG. 12 depicts an ideal phase ramp.
Figure 13:
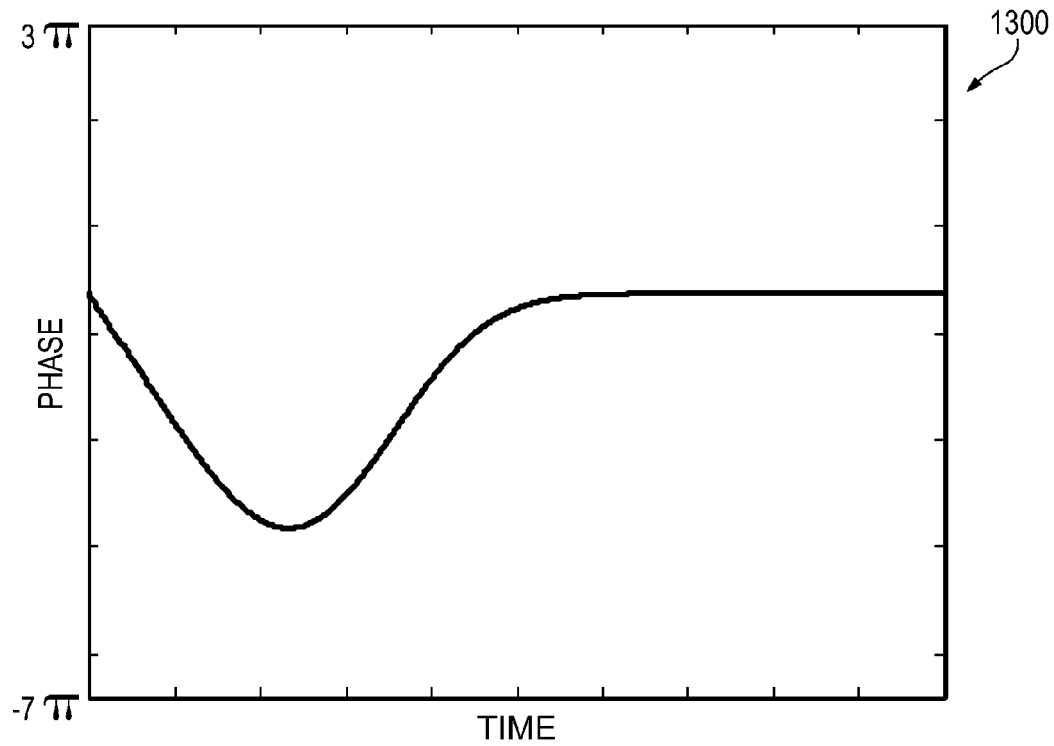
FIG. 13 depicts a flattened phase ramp.
Figure 14:
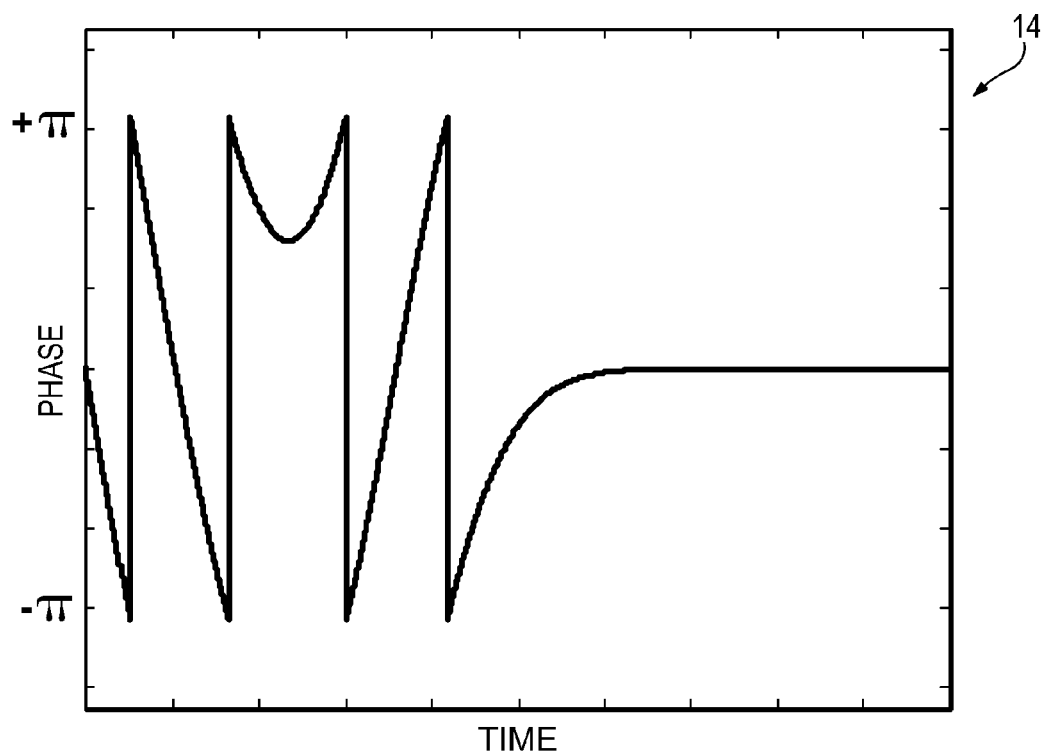
FIG. 14 depicts a flattened instantaneous phase waveform.

Step 4: Flatten the instantaneous phase waveform based on the estimate of the second frequency. In some embodiments, this step comprises the following steps: (1) Generate an ideal unwrapped instantaneous phase waveform 1200 as shown in FIG. 12, also referred to herein as an "ideal phase ramp" for simplicity. The ideal phase ramp is a straight line having a slope equal to 2π×F2$_{EST}$ radians/second. The y-intercept of the ideal phase ramp may be set to any arbitrary value, however, for reasons that will become evident below, it is beneficial to set the y-intercept such that the final value of the ideal phase ramp equals the final value of the measured phase ramp. (2) Subtract the ideal phase ramp from the measured phase ramp to produce an unwrapped flattened instantaneous phase waveform 1300 as shown in FIG. 13, also referred to herein as a "flattened phase ramp" for simplicity. Optionally, the flattened phase ramp may be wrapped to produce a flattened instantaneous phase waveform 1400 as shown in FIG. 14.

The flattened instantaneous phase waveform settles to zero radians because the final value of the ideal phase ramp equals the final value of the measured phase ramp. The flattened instantaneous phase waveform is flat in the region that corresponds to the settled period because, in that period, the phase accumulation rate of the ideal phase ramp and the phase accumulation rate of the measured phase ramp are equal. However, the flattened instantaneous phase waveform is not flat in other regions because there the phase accumulation rate of the measured phase ramp is different.

Some embodiments include an optional step 5 in which either the user or the test and measurement instrument 615 makes fine adjustments to the estimate of the second frequency in order to optimize the flattened phase transient response. That is, the user or the test and measurement instrument may slightly increase or decrease the estimated second frequency until the settled period of the flattened instantaneous phase waveform is as flat as possible and its duration is maximized. This additional step is particularly useful if the instantaneous frequency waveform is noisy or if the settled period is too brief to provide an accurate frequency measurement.

Figure 15:
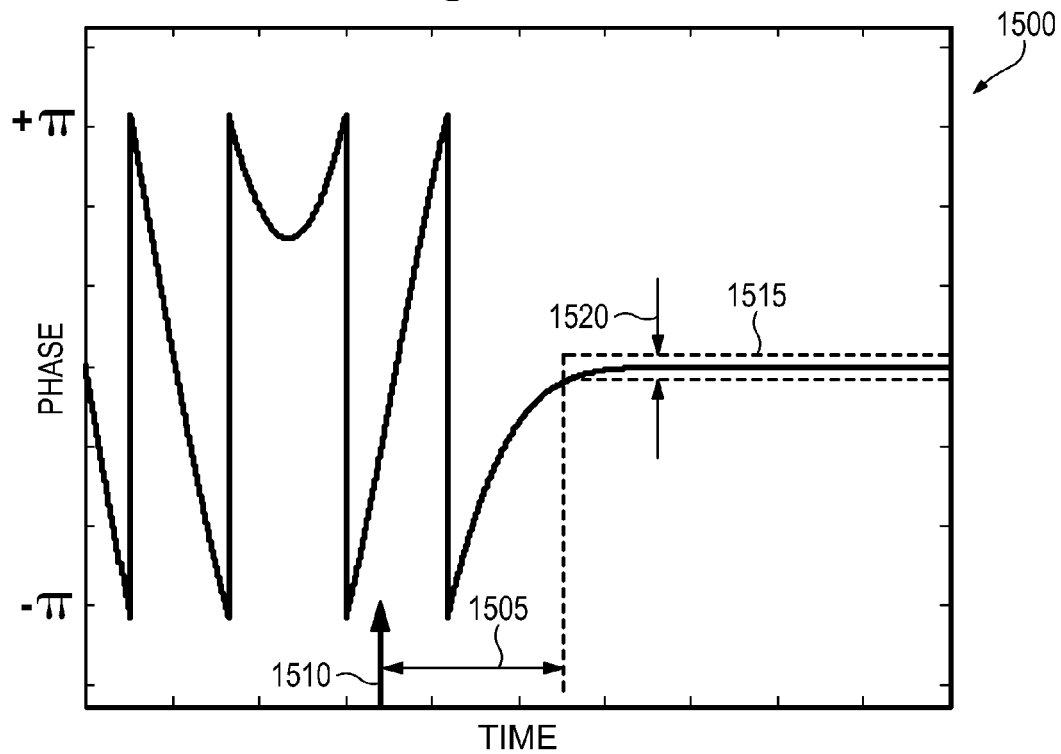
FIG. 15 depicts a phase settling time measurement.

In some embodiments, the test and measurement instrument 410 may provide a measurement of the phase settling time of the phase transient response. Referring now to FIG. 15, phase settling time equals the time duration 1505 between a time reference point 1510 and the beginning of the settled period 1515. The time reference point 1510 may be a trigger event detected by the test and measurement instrument 410 or a point selected by the user. The settled period may be located by identifying all of the contiguous points of the flattened instantaneous phase waveform after the hop whose phase values all equal the same phase value within a specified tolerance range 1520. For example, the settled period may consist of the set of contiguous points whose phase values all equal zero radians within one milli-radian.

It will be appreciated that the embodiments described above are not limited to operating on signals having only a single frequency hop as illustrated in the Figures, but also may be applied to signals having a plurality of frequency hops. For example, given an instantaneous voltage waveform that represents a signal having a plurality of frequency hops, a test and measurement instrument may: (Step 1) Calculate an instantaneous phase waveform based on the instantaneous voltage waveform. (Step 2) Calculate an instantaneous frequency waveform based on the instantaneous voltage waveform. (Step 3) Calculate an estimate of each of the "hopped to" or "destination" frequencies based on the instantaneous frequency waveform by (1) locating each of the segments of the instantaneous frequency waveform that correspond to a period where the output signal has settled to a destination frequency, and (2) calculating the average frequency value of all of the points within each of the settled periods to produce an estimate of each of the destination frequencies. (Step 4) Flatten each of the settled periods of the instantaneous phase waveform based on the estimates of the destination frequencies.

In the embodiments described above, the ideal phase ramp is generated based on the estimate of the second frequency, which is determined from the instantaneous frequency waveform. In an alternative embodiment, the ideal phase ramp is generated directly from the measured phase ramp, thereby eliminating the need to calculate the instantaneous frequency waveform. In that embodiment, a curve fitting algorithm such as a linear least squares algorithm is used to fit a straight line to the settled period of the measured phase ramp, and then that straight line is extrapolated to produce the ideal phase ramp. The settled period can be located by identifying the set of contiguous points of the measured phase ramp whose values all equal the values of the straight line within a specified tolerance range.

It will be understood that the methods described herein are not only useful for measuring the phase transient response of a PLL, but may also be used to measure the phase transient response of any device or system that can produce a frequency-hopped output signal such as a voltage controlled oscillator, a mixer, and the like.

In various embodiments, the processor 610 may be implemented in hardware, software, or a combination of the two, and may comprise a general purpose microprocessor, a digital signal processor (DSP), an application specific integrated circuit (ASIC), a field-programmable gate array (FPGA), or the like. Furthermore, although the methods described above are described as being performed by a processor of a test and measurement instrument, it will be appreciated that in other embodiments the instantaneous voltage waveform may be transmitted to another computer (not shown) and the methods described above may be performed by a processor of that computer.

It will be appreciated from the foregoing discussion that the present invention represents a significant advance in the field of phase transient response measurements. Although specific embodiments of the invention have been illustrated and described for purposes of illustration, it will be understood that various modifications may be made without departing from the spirit and scope of the invention. Accordingly, the invention should not be limited except as by the appended claims.

What is claimed is:

1. A method of measuring the phase transient response of a device under test based on an instantaneous voltage waveform that represents an output signal of the device under test as it steps from a first frequency to a second frequency, the method comprising the steps of:
   calculating an instantaneous phase waveform based on the instantaneous voltage waveform;
   calculating an instantaneous frequency waveform based on the instantaneous voltage waveform;
   automatically estimating the second frequency based on the instantaneous frequency waveform without any user intervention; and
   flattening the instantaneous phase waveform based on the estimate of the second frequency.

2. A method as in claim 1 wherein the step of calculating an instantaneous phase waveform comprises the steps of:
   generating a replica of the instantaneous voltage waveform that is phase-shifted by $\pi/2$ radians; and
   calculating the instantaneous phase waveform based on the instantaneous voltage waveform, the phase-shifted replica, and an arctangent function.

3. A method as in claim 1 wherein the step of calculating an instantaneous frequency waveform comprises the step of differentiating the instantaneous phase waveform to produce the instantaneous frequency waveform.

4. A method as in claim 1 wherein the automatically estimating step comprises the steps of:
   locating a segment of the instantaneous frequency waveform that corresponds to the period where the output signal has settled to the second frequency; and
   calculating the average frequency value of all of the points within the settled period to produce the estimate of the second frequency.

5. A method as in claim 4 wherein the locating step comprises the step of identifying a set of contiguous points whose frequency values all equal the same frequency value within a specified tolerance range.

6. A method as in claim 1 wherein the step of flattening the instantaneous phase waveform comprises the steps of:
   generating an ideal instantaneous phase waveform; and
   subtracting the ideal instantaneous phase waveform from the instantaneous phase waveform to produce the flattened instantaneous phase waveform.

7. A method as in claim 1 further comprising the step of adjusting the estimate of the second frequency in order to optimize the flattened instantaneous phase waveform.

8. A test and measurement instrument that measures a phase transient response of a device under test according to the method of claim 1.

9. A method of measuring the phase transient response of a device under test based on an instantaneous voltage waveform that represents an output signal of the device under test as it steps from a first frequency to a second frequency, the method comprising the steps of:
   calculating an instantaneous phase waveform based on the instantaneous voltage waveform;
   automatically generating an ideal instantaneous phase waveform based on the instantaneous phase waveform without any user intervention; and
   flattening the instantaneous phase waveform based on the ideal instantaneous phase waveform.

* * * * *